United States Patent
Carlson et al.

(10) Patent No.: US 10,148,258 B2
(45) Date of Patent: Dec. 4, 2018

(54) POWER SUPPLY VOLTAGE MONITORING AND HIGH-RESOLUTION ADAPTIVE CLOCK STRETCHING CIRCUIT

(71) Applicant: Mellanox Technologies, Ltd., Yokneam (IL)

(72) Inventors: Andrew Carlson, Westborough, MA (US); Carl Ramey, Westborough, MA (US)

(73) Assignee: Mellanox Technologies, Ltd., Yokneam (IL)

( * ) Notice: Subject to any disclaimer, the term of this patent is extended or adjusted under 35 U.S.C. 154(b) by 114 days.

(21) Appl. No.: 15/279,002

(22) Filed: Sep. 28, 2016

(65) Prior Publication Data

US 2018/0091125 A1 Mar. 29, 2018

(51) Int. Cl.
| | |
|---|---|
| *G06F 1/04* | (2006.01) |
| *H03K 3/00* | (2006.01) |
| *H03K 5/06* | (2006.01) |
| *H03K 5/19* | (2006.01) |
| *G06F 1/32* | (2006.01) |
| *G01R 31/317* | (2006.01) |
| *H03K 5/135* | (2006.01) |

(52) U.S. Cl.
CPC .......... *H03K 5/06* (2013.01); *G01R 31/31725* (2013.01); *G06F 1/324* (2013.01); *G06F 1/3206* (2013.01); *H03K 5/19* (2013.01); *H03K 5/135* (2013.01)

(58) Field of Classification Search
CPC .... G06F 1/10; G06F 1/04; G06F 1/08; H03K 5/135; G11C 7/22
USPC ............................ 327/291–298; 713/500–503
See application file for complete search history.

(56) References Cited

U.S. PATENT DOCUMENTS

| | | | |
|---|---|---|---|
| 7,436,245 B2 | 10/2008 | Nguyen | |
| 7,577,862 B2* | 8/2009 | McClendon | G06F 1/206 |
| | | | 713/300 |
| 7,816,958 B2 | 10/2010 | Sundby | |
| 9,607,153 B2* | 3/2017 | Tiri | G06F 1/04 |
| 2003/0112038 A1 | 6/2003 | Naffziger et al. | |
| 2004/0119521 A1 | 6/2004 | Kurd et al. | |
| 2008/0224752 A1* | 9/2008 | Lee | G06F 1/3203 |
| | | | 327/292 |
| 2012/0043982 A1 | 2/2012 | Carpenter et al. | |

(Continued)

OTHER PUBLICATIONS

T. Fischer et al., "A 90nm Variablee-Frequency Clock System for a Power-Managed Itanium®-Family Processor," ISSCC Dig. Tech. Papers, Paper 16.2, pp. 294-295, Feb. 2005.

(Continued)

*Primary Examiner* — Quan Tra
(74) *Attorney, Agent, or Firm* — Alston & Bird LLP

(57) ABSTRACT

An integrated circuit and method are described for compensating for voltage droop on an integrated circuit using a power supply voltage monitoring circuit and a high-resolution adaptive clock stretching circuit. In some example embodiments, the method includes monitoring power supply voltage on an integrated circuit, detecting a voltage droop such as a dynamic loss of power supply in the integrated circuit, and stretching a current clock cycle, according to the detected voltage droop, to provide more time for logic on the integrated circuit to complete before a next clock cycle.

10 Claims, 7 Drawing Sheets

(56) References Cited

U.S. PATENT DOCUMENTS

2013/0318364 A1 11/2013 Berry, Jr. et al.
2017/0075404 A1* 3/2017 Kitaji .................... G06F 1/3287

OTHER PUBLICATIONS

Kurd, N. et al. "Next generation intel core micro-architecture (nehalem) clocking," IEEE Journal of Solid-State Circuits, vol. 44, pp. 1121-1129, Apr. 2009.
Grenat et al. "Adaptive clocking system for improved power efficiency in a 28nm x86-64 microprocessor." Solid-State Circuits Conference Digest of Technical Papers (ISSCC), 2014 IEEE International, 2014, pp. 106-107.
European Search Report received for Application No. 17193595.0 dated Feb. 19, 2018.

* cited by examiner

POWER SUPPLY VOLTAGE MONITORING AND HIGH-RESOLUTION ADAPTIVE CLOCK STRETCHING CIRCUIT

TECHNOLOGICAL FIELD

Embodiments of the present invention relate generally to integrated circuits, and more particularly to integrated circuits capable of monitoring a power supply and clock stretching in response to a voltage droop.

BACKGROUND

This present invention relates to integrated circuits and particularly to handling voltage droop on an integrated circuit. Increases in integration density have contributed to higher power densities in modern integrated circuits, while at the same time on-die wire resistivity has also increased. As a result of these advancements, both static and dynamic losses can occur in a power grid of an integrated circuit, these losses adversely affecting the performance of the circuit in the completion of its operations.

BRIEF SUMMARY

Embodiments of the present invention compensate for voltage drop by dynamically adjusting the clock frequency of an integrated circuit during its operation. The circuit detects a drop in the power supply that may cause a timing failure and responds by stretching the waveform of the clock, so that logic gates on an integrated circuit have more time to complete during that cycle. Furthermore, embodiments of the invention implement a filter and phase generator to allow for higher resolution control than other conventional approaches.

In this regard, the invention includes integrated circuits and methods for handling voltage droop. In one example embodiment, an integrated circuit comprises a delay chain system comprising a plurality of delay chains, wherein each delay chain comprises a delay chain path and each delay chain path comprises a different length. The integrated circuit of this embodiment also comprises a controlled set of capture flops configured to sample each delay chain path every clock cycle to determine if the logic in the delay chain path completed during each clock cycle, and an adder configured to sum the number of delay chain paths determined to have passed each clock cycle. The integrated circuit of this embodiment further comprises a filter configured to filter the sum of the number of delay chain paths determined to have passed each clock cycle, a clock phase generator and validator, configured to generate a plurality of independent clock phases and configured to determine a plurality of valid clock phases, and a clock phase multiplexer configured to shift from a current clock phase to a next clock phase selected from the plurality of valid clock phases.

Additionally, in some cases the delay chain system of the integrated circuit may comprise a synchronizer configured to synchronize the sampled values from the delay chain path prior to summing the number of paths passing.

In some examples, the filter of the integrated circuit configured to filter the sum of the number of delay chain paths determined to have passed each clock cycle is configured as a Kalman Filter.

In another example embodiment, a method for handling voltage droop on an integrated circuit comprises: monitoring power supply voltage in the integrated circuit, detecting a voltage droop comprising a dynamic loss of power supply in the integrated circuit, and stretching a current clock cycle, according to the detected voltage droop, to provide more time for logic on the integrated circuit to complete before a next clock cycle.

In some cases monitoring supply voltage on the integrated circuit may further comprise running a plurality of delay chains in the integrated circuit, wherein the plurality of delay chains comprises individual delay chain paths, each delay chain path comprising a different length, sampling each of the plurality of delay chain paths every clock cycle, wherein each delay chain path is sampled during a current clock cycle from a controlled set of capture flops to determine if the logic in the delay chain path completed during the current cycle, and summing a number of valid delay chain paths to obtain a variable output sum, wherein valid delay chain paths comprise delay chain paths whose logic completed in the current cycle, and wherein the variable output sum is a representation of the power supply voltage level during each clock cycle.

Additionally, in some examples, monitoring supply voltage in the integrated circuit may further comprise, prior to summing valid delay chain paths to obtain the variable output sum, synchronizing an output of each of the plurality of delay chain paths to prevent errors in the variable output sum due to metastability in the delay chain paths.

In some examples, detecting the voltage droop in the integrated circuit may comprise filtering the variable output sum to reduce a difference between the output sum representation of the power supply voltage level and the actual supply voltage level experienced on the integrated circuit, wherein the difference is caused by circuit noise, and determining from the filtered variable output sum the voltage droop on the integrated circuit.

Additionally, in some cases, filtering the variable output sum comprises utilizing a Kalman filter.

In some examples, the method for handling voltage droop on an integrated circuit may include stretching the current clock cycle by: generating a plurality of independent clock phases, wherein each of the plurality of clock phases comprises a rising edge, and wherein the plurality of independent clock phases together form a distribution of clock phases, wherein the rising edges of the plurality of clock phases in the distribution are offset by a uniform time interval, determining a number of valid clock phases, wherein a valid clock phase comprises a clock phase comprising a rising edge which occurs before the rising edge of a current clock phase, determining a next clock phase from the number of valid clock phases based on the detected voltage droop, wherein the next clock phase comprises a next clock rate which will allow the integrated circuit to complete all circuits in the next clock rate cycle, and shifting from the current clock phase to the next clock phase.

In some examples, determining a next clock phase comprises determining from the valid clock phases a plurality of clock phases that are not delayed more than half a clock cycle from the current clock phase, and determining the next clock phase from the determined plurality of clock phases.

In some examples, the method for handling voltage droop on an integrated circuit may further include monitoring supply voltage in the integrated circuit during the detected voltage droop, detecting a recovery of supply voltage during the detected voltage droop, and dynamically adjusting the clock rate, according to the recovered supply voltage, to increase the clock rate.

BRIEF DESCRIPTION OF THE DRAWINGS

Figure 1:
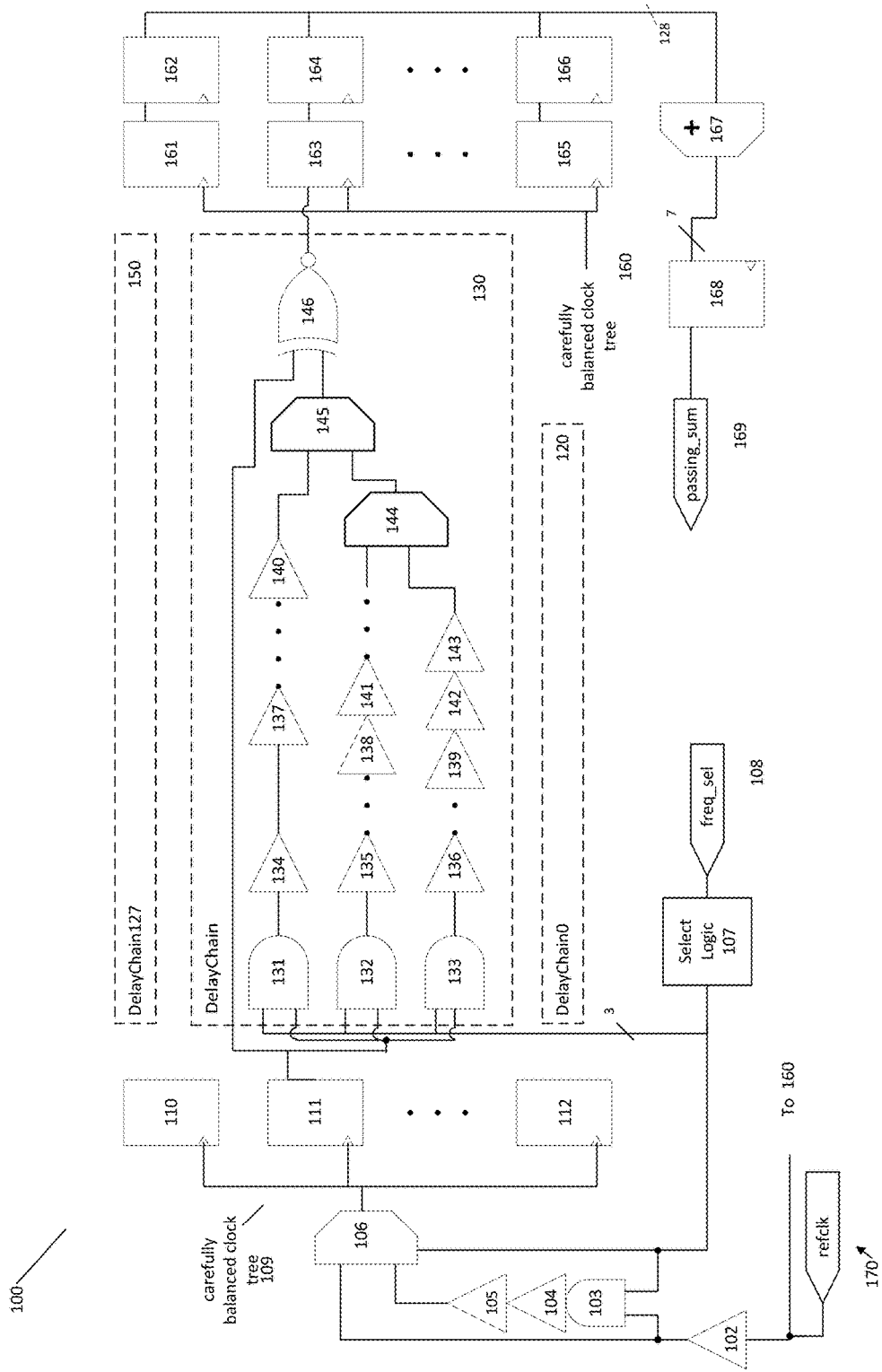
Figure 2:
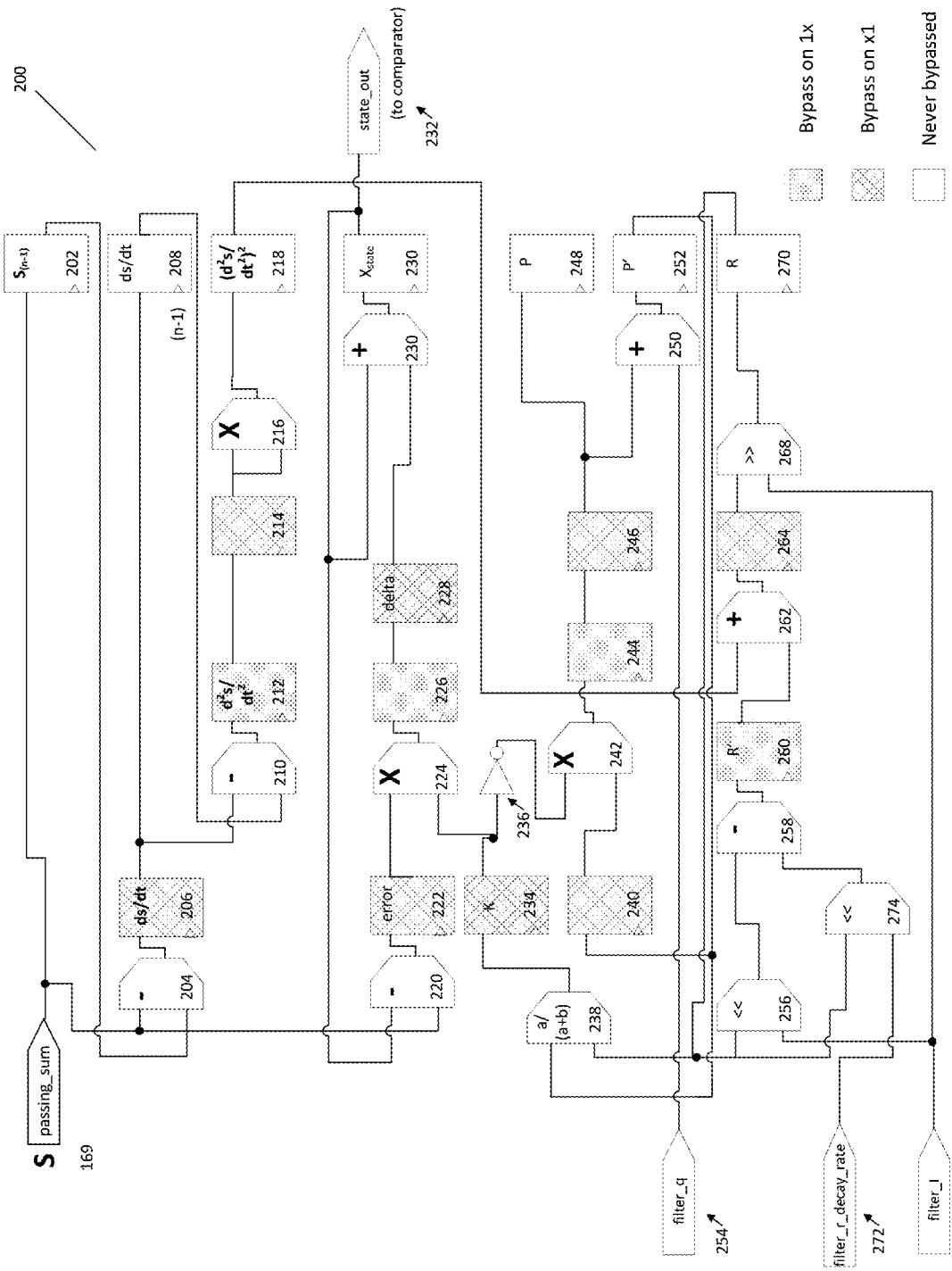
Figure 3:
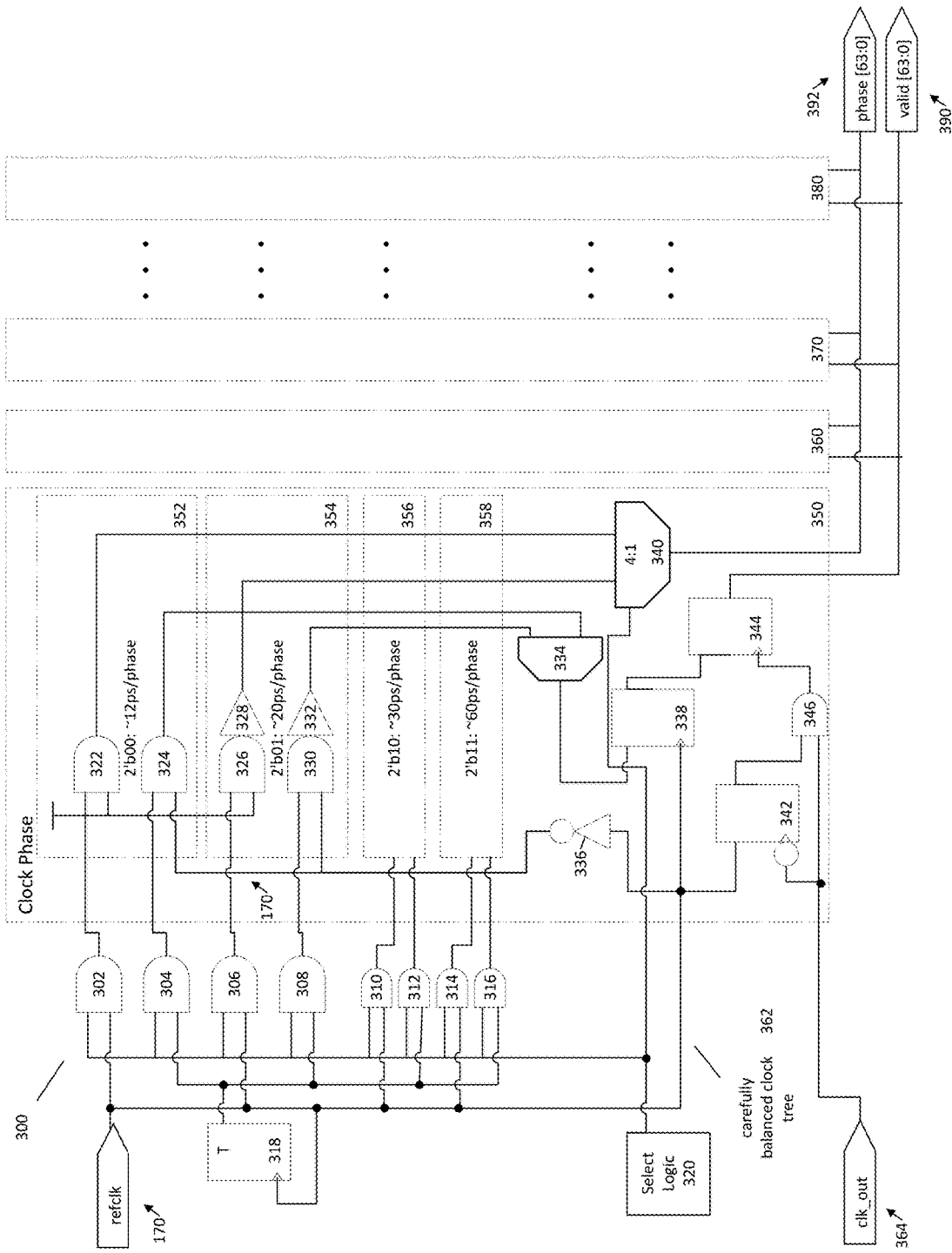
Figure 4:
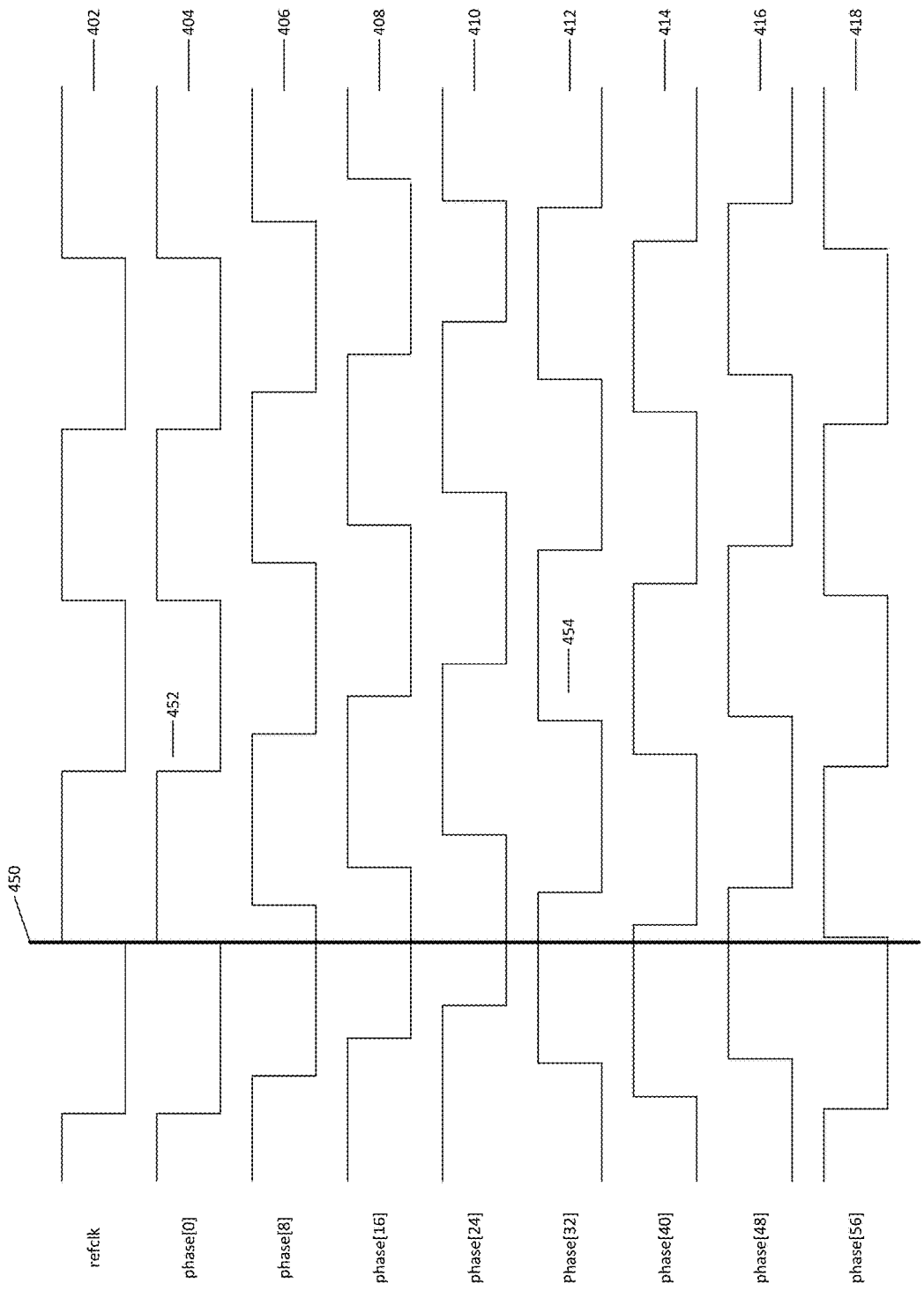
Figure 5:
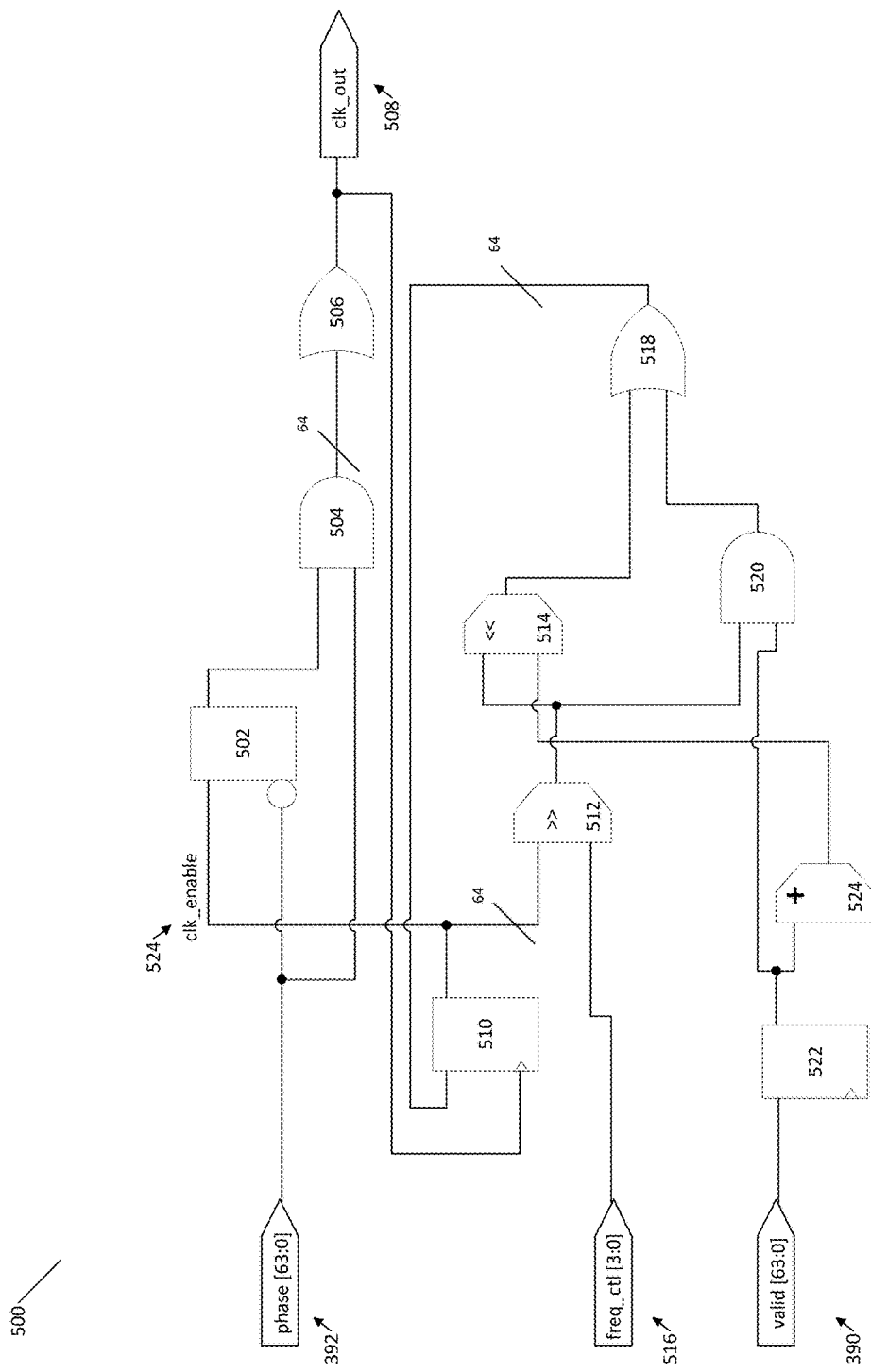
Figure 6:
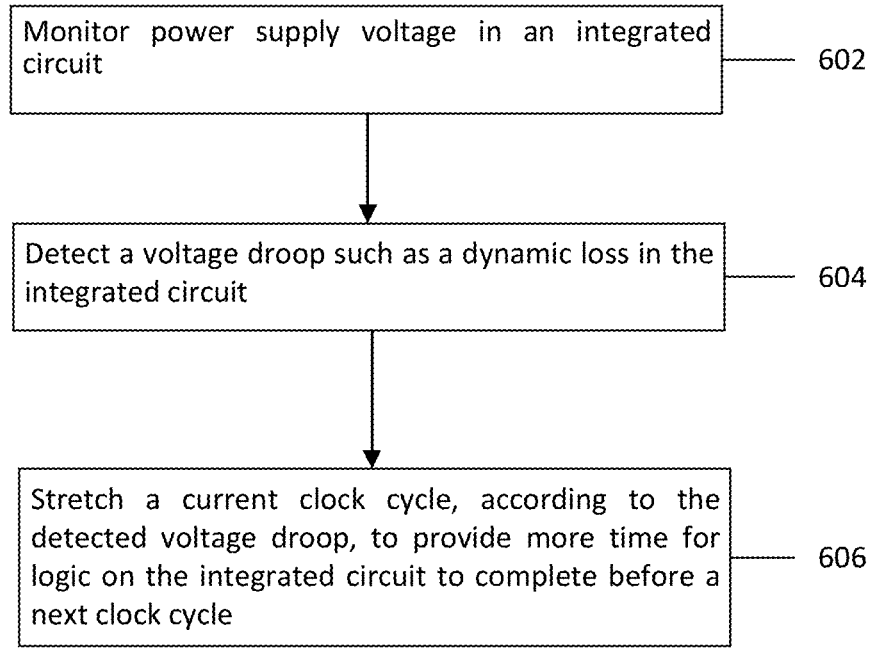
Figure 7:
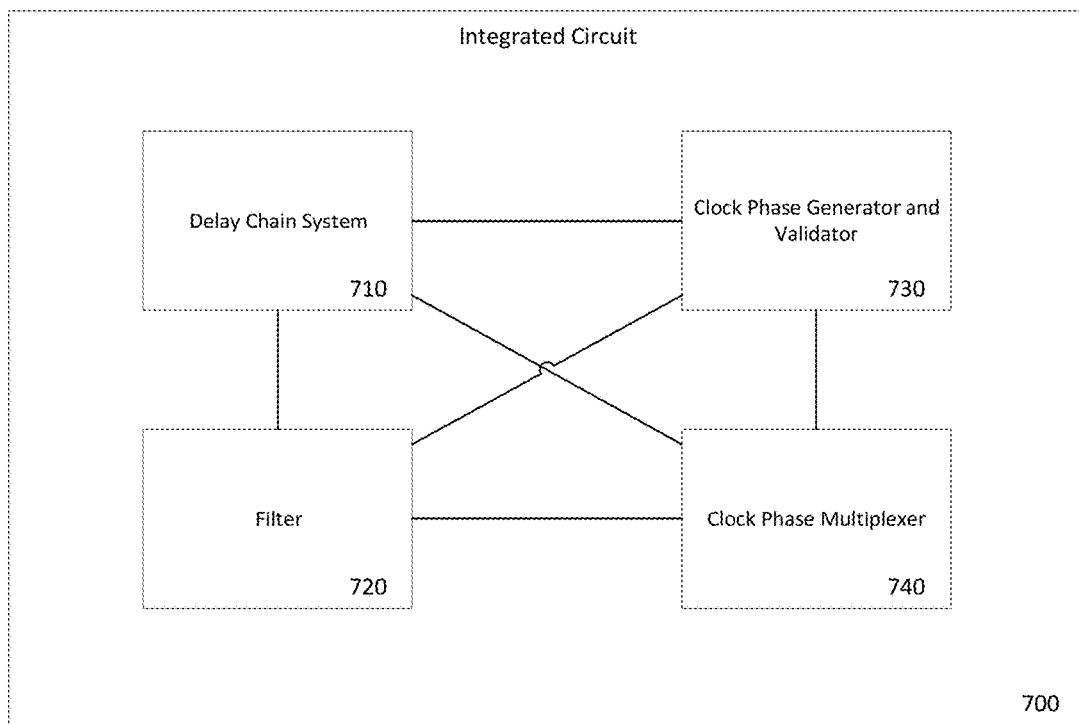

Having thus described embodiments of the invention in general terms, reference will now be made to the accompanying drawings, which are not necessarily drawn to scale, and wherein:

FIG. 1 illustrates a block diagram of delay chains on an integrated circuit in accordance with some example embodiments of the present invention;

FIG. 2 illustrates a block diagram of a filter implemented on an integrated circuit in accordance with some example embodiments of the present invention;

FIG. 3 illustrates a block diagram of a clock phase generator and validator implemented on an integrated circuit in accordance with some example embodiments of the present invention;

FIG. 4 illustrates a timing diagram of generated clock phases in accordance with some example embodiments of the present invention;

FIG. 5 is an example block diagram of example components of a clock phase multiplexer configured to select a next clock phase in accordance with some example embodiments of the present invention;

FIG. 6 is a flowchart illustrating an example method for power supply voltage monitoring and high-resolution adaptive clock stretching in accordance with some example embodiments of the present invention; and FIG. 7 is an example block diagram of components of an integrated circuit accordance with some example embodiments of the present invention.

DETAILED DESCRIPTION

Static loss, or IR drop, manifests in integrated circuits as a DC voltage differential between the transistors on the chip and the regulated supply power provided to the chip. This voltage differential is usually less than 10 mV per rail. Dynamic losses, sometimes called di/dt or voltage droop, are transient events with peaks differentials that can reach up to 100 mV per rail on an integrated circuit during a voltage droop event.

In general, voltage droop can be caused by a variety of events. For example, an integrated circuit may suddenly require an increase in power when going from a semi-idle state to processing a large workload. During this transition, the integrated circuit requires a large amount of power, but due to physical constraints, the input power may not be able to immediately provide the required power. The integrated circuit will continue to perform its operations and if the required power is not provided, the integrated circuit will begin drawing from the large reserve capacitance in all of the transistors on the integrated circuit. As the reserve capacitance is depleted, the integrated circuit then begins to fail to complete its operations during the clock cycles of the current clock frequency.

The failure of the operations to complete in the integrated circuit may be due to logic gates operating slower than designed during a voltage droop. This slower operation requires a slower clock frequency or higher supply power margin to avoid setup failures in the logic gates. The supply power margin has historically been applied in a constant fashion, either in the design of the chip or in the fusing of frequency vs. voltage points at characterization. This approach is expensive in terms of power, requiring either larger, high leakage gates or an increase in voltage for a given frequency (which active power follows as $\sim V^2$).

Presently, the simplest and most common approach to handling voltage droop on an integrated circuit has been to apply a constant amount of supply margin, either by lowering the frequency at a given voltage or by increasing the voltage at a certain frequency. More recently, circuit techniques to recover some of this margin have been investigated. Some example methods for handling voltage droop include feeding the voltage of the logic into the Phase Lock Loop as an attempt to improve the correlation between clock frequency and timing path delays. Other solutions for handling voltage droop have included a digital system of stretching the clock a certain amount when the voltage droop exceeds a certain threshold. The stretch amount and droop threshold are determined experimentally to balance stretching too long during minor droops, which degrades the overall average frequency, and can result in not stretching the clock long enough during major droops, which requires a more constant frequency/voltage margin. Each of these solutions requires providing more supply power than needed or having a slower clock frequency than needed. Furthermore, these solutions do not allow adapting to voltage droop in a high resolution and dynamic manner.

In accordance with one embodiment of this invention, high resolution voltage monitoring and clock stretching are used to optimize performance of an integrated circuit versus power used by an integrated circuit during a voltage droop. The integrated circuit responds to voltage droops by stretching out the clock, allowing more time for the droop-affected logic to complete before raising the next clock cycle. This is accomplished by implementing a voltage droop monitor and filter to detect voltage droop on an integrated circuit. The voltage droop monitor and filter are constructed as to be resilient to electromagnetic noise and to react dynamically to changing environments. Furthermore, a clock stretching circuit has been implemented on an integrated circuit by generating independent clock phases, validating the generated clock phases, and multiplexing among validated clock phases and the input clock to select a next clock phase, which will stretch the clock and allow for logic gates on the circuit to complete operations during a voltage droop event. In some embodiments, the integrated circuit of the present invention is highly configurable to provide high resolution (e.g. 1-3 mV, 3% clock frequency) monitoring and clock stretching over a wide range of clock frequencies (e.g. 300 MHz-2 GHz).

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "data," "content," "information," and similar terms may be used interchangeably, according to some example embodiments, to refer to data capable of being transmitted, received, operated on, and/or stored. Moreover, the term "exemplary," as may be used herein, is not provided to convey any qualitative assessment, but instead merely to convey an illustration of an example. Thus, use of any such terms should not be taken to limit the spirit and scope of embodiments of the present invention.

FIG. 1 is an example block diagram of components of an example delay chain system 100 on an integrated circuit. In some embodiments, the delay chain system includes a carefully balanced clock tree 109. The carefully balanced clock tree 109 is configured to receive an input clock signal, such as reference clock input refclk 170. In some examples, the carefully balanced clock tree 109 further includes logic to control the clock tree including logic blocks 102, 103, 104, 105, and 106. In some examples, the carefully balanced clock tree 109 controls the timing of the launch flops 110, 111, and 112 at the beginning of the delay chains of the delay chain system 100.

In some examples, the delay chain system 100 comprises delay chains such as DelayChain0 120, DelayChain 130, and DelayChain127 150. Each of the delay chains comprises logic gates forming delay chain paths. For example, DelayChain 130 comprises logic gates forming a delay chain path via logic blocks 131, 132, 133, 134, 135, 136, 137, 138, 139, 140, 141, 142, 143, 144, 145, and 146.

In some example embodiments, the delay chain system 100 comprises capture flops such as capture flops 161, 163, and 165 and synchronizers 162, 164, and 166. The capture flops and synchronizers may be used to sample the output of the delay chains. For example, capture flop 163 samples the output of DelayChain 130 during each clock cycle. In some examples, the capture flops are controlled by a carefully balanced clock tree 160, which may be similar in construction and implementation to carefully balanced clock tree 109.

In some example embodiments, the delay chain system 100 comprises 128 delay chains of uniformly distributed lengths. In some examples, this includes DelayChain0 120 and DelayChain127 150, and a plurality of delay chains of uniformly distributed lengths between DelayChain0 120 and DelayChain127 150, such as DelayChain 130.

In some example embodiments, at the start of a clock cycle, data is launched from a dedicated launch flop at the start of each delay path. In some examples, the dedicated flops include launch flops 110, 111, 112. For example, launch flop 111 launches the data for DelayChain 130 at the beginning of each clock cycle. In some examples, the data launched into the delay chains is alternated every clock cycle. In some examples, the data also alternates from chain to chain, such that neighboring chains are switching in opposite directions.

In further examples, each delay chain from DelayChain0 120 to DelayChain127 150 differs from its neighbors by a nominal delay difference. In some examples, the nominal delay difference may be chosen to be smaller or larger than a typical logic gate delay. In some examples, a sharp edge rate is maintained to avoid non-linearly increasing delays in longer delay chains, such as DelayChain127 150. In some examples, the output of each delay chain is XNOR'ed with the data from its launch flop (without delay), such that the final value of each chain becomes a high signal (1'b1) after the specified delay. For example, in DelayChain 130, the output of the delay chain logic at logic block 145 is XNOR'ed with the output from launch flop 111. Since data changes every cycle, some examples include additional logic to ensure the final measurement of the average voltage supply level is not affected by delay chains that have not cleared from a previous cycle.

In some examples, the delay chain system is configured to measure the average voltage supply level, wherein a carefully controlled set of capture flops samples simultaneously each delay chain every clock cycle. In some examples, carefully controlled capture flops includes capture flops 161, 163, and 165. For example, DelayChain 130 is sampled by capture flop 161. In some examples, timing that determines whether a chain samples high (completed) or low (failed) includes clock trees on the launch side of the delay chains and the capture side of the delay chains. In some examples, Select Logic 107 and freq_sel 108 are used to determine the timing of whether a delay chain samples high or low. In some examples, the clock trees are carefully balanced clock trees such as carefully balanced clock tree 109 and carefully balanced clock tree 160.

In some examples, timing of the clock cycles is calibrated such that the target clock period is sufficient for some but not all of the delay chains to pass. During a voltage droop event, the delay chains slow down, but the clock does not, resulting in fewer chains passing. For example, during a voltage droop event capture flop 163 may sample a low value from DelayChain 130 indicating that DelayChain 130 failed to complete during the clock cycle. In some examples, the distribution of delay chains and calibrated timing introduces a high risk of metastability, since there may be multiple delay chains completing their respective logic during a setup/hold window of the sampling capture flop. In some examples, to address the risk of metastability, the output of each delay chain is passed through a synchronizer.

In some embodiments of delay chain system 100, variation and electromagnetic noise can cause errors in processing the delay chains into a passing_sum 169. Furthermore, noise and variation may occur in delay chains of single transistor devices, such as DelayChain 130. In some examples, the length of the delay chains and the sharp edge rate will decrease variability. However, in some examples, the delay of each delay chain will be some small percentage greater or less than its nominal design point. For example, a delay chain may be faster than its shorter neighbor, indicating that the logic gates of the delay chain have completed before the logic gates of the shorter neighbor delay chain. In some examples, in order to reduce sensitivity to the variation of the delay chains, the outputs of the chains are summed into a 7-bit variable. For example, the output of the chains can be summed at adder 167 into the register 168 and the passing sum passing_sum 169. To the extent that the distribution of delays is uniform, even if out of order, the output passing sum will be linear with the true voltage-induced delay occurring on the integrated circuit. Summing the plurality of delay chain outputs may reduce the number of potential errors from the variation in the delay chains, but does not address electromagnetic noise found in the delay, which can vary from cycle to cycle and may be correlated among the various chains. To address noise, a filter may be applied to the output sum as discussed in relation to FIG. 2.

FIG. 2 is an example block diagram of components of an example filter 200 on an integrated circuit configured to filter the passing_sum 169 of the delay chains. In some examples, the high resolution measurements of the delay chain system 100 may further require minimizing electromagnetic noise so that the circuit response to a voltage droop does not cause the circuit to overreact to the voltage droop or become unstable. In some examples, noise on the circuit may come from the power supply. For example, the power supply may cause noise due to local circuit operation in addition to chip-wide voltage droops that the integrated circuit of the present invention is measuring. In some examples, there may be further electromagnetic noise affecting the power supply or the propagation through the delay chains.

In some examples, an additional problem includes electromagnetic noise present in the measurement of the supply voltage performed by the integrated circuit in delay chain system 100. This noise may arise from jitter in the time interval used to sample the supply voltage, differences in propagating a 1 versus a 0 in the various chains, any metastability that escapes the synchronizer, and/or other sources in short time scales. In some examples, there may also be variations in temperature at longer time scales or even process variation/aging at quasi-static time scales. Noise on a signal can lead to overreaction in clock stretching by the integrated circuit in response to a voltage droop and may cause instability of the system. The example filter 200 may be configured to filter only the noise that does not truly represent the voltage droop seen by the logic on the chip.

In some examples, spurious noise on an integrated circuit can cause errors on the signals from the delay paths. For example, during a voltage droop, passing_sum 169 may indicate that 90 delay paths are passing on a first cycle. During the next cycle, passing_sum 169 may indicate that 100 delay paths are passing due to noise on the integrated circuit. The unfiltered passing_sum 169 indicating 100 delay paths passing would indicate that the voltage droop is ending, even though this is a false indication caused by noise on the integrated circuit. Filtering the passing_sum 169 in filter 200 results in a ensuring that the state_out 232 or a control signal responds only to voltage droops actually occurring on the integrated circuit. For example, the indication of 100 delay paths passing would be filtered out among a sequence of passing_sum 169's indicating that the voltage droop event is continuing.

In some examples, the filter 200 includes a simple implementation of a Kalman filter to estimate the power supply voltage in a potentially noisy environment. The power supply voltage may be modeled using the following equations:

$$x_k = x_{k-1} + w_{(k-1)} \quad (1)$$

$$z_k = x_k + v_k \quad (2)$$

In equations 1 and 2, k is a time index, x is the state of the system (in this case, the supply voltage), z is the measurement of the state (the sum of passing delay paths or passing_sum 169), and $v \sim N(0, R)$ and $w \sim N(0, Q)$ are Gaussian noise.

In some examples, the filter 200 utilizes two sets of equations to estimate the state x and variance P of the system at each time step. The first set of equations describes how the system should propagate on its own:

$$(x')_k = x_{(k-1)} \quad (3)$$

$$P'_k = P_{(k-1)} + Q \quad (4)$$

In equations 3 and 4, $(x')_k$ is the best estimate of x at time k. In some examples, these equations can be characterized in words as representing a roughly constant voltage, with noise injection. The second set of equations applies the information from the measurement:

$$K_k = (P'_k)/(P'_k + R) \quad (5)$$

$$(x)_k = (x')_k + K_k(z_k - (x')_k) \quad (6)$$

$$P_k = (1 - K_k) * P'_k \quad (7)$$

In these equations, K represents the Kalman gain. Equation 5 provides more gain to the filter when noise R in the system is small. Equation 6 updates the estimate by applying the gain to the error between a latest measurement and a previous estimate. Equation 7 describes the variance of the state estimate. For example, when the gain K is high, the variance is small, and vice versa.

In some examples, approximations can be made on the integrated circuit to accelerate the computation of these equations. For example, it may not be necessary to calculate K with great precision; for example, a 6-bit calculation may provide sufficient accuracy. In some example embodiments, the filter 200 is designed to take advantage of the division being of the form A/(A+B), for example at logic block 238, to write a special approximation state table, based on the position of the most significant high bit in each.

In some examples, to estimate the noise R, the circuit calculates the second derivative of the passing_sum 169, S, as shown in Equation 8.

$$dR/dt + D/L * R1/L * ((d^2S)/(dt^2))^2 \quad (8)$$

In this equation, $D \leq L-1$ and D and L are also configurable parameters. In some examples, filter_1 276 is an input equal to $\log_2 L$. Furthermore, in some examples, filter_r_decay_rate 272 is equal to $\log_2 D$. In some examples, this choice limits the possible values of L and D to powers of two, but an implementation of the filter would not necessarily need to be so constrained, or necessarily use equation 9. In some examples, if there is a stable magnitude of the second derivative, the solution to this differential equation equates to an exponential decay towards that value with gain 1/D and time constant L/D. In some examples, estimation of the noise R is implemented by first approximating dS/dt with the difference in S at two subsequent time points, i.e., $dS_n/dt = S_n - S_{n-1}$. This value is also compared to its corresponding value from the previous time point, i.e., $d2S_n/dt2 = dS_n/dt - dS_{n-1}/dt$. The second derivative is then squared. The weighted difference is calculated by shifting by the log 2 of L and D, as shown in equation 9:

$$R_{(n+1)} = [LR_n - DR_n + (d^2S/dt^2)^2]/L \quad (9)$$

The logic steps for these equations and determining the state_out 232 are shown in the logic blocks of FIG. 2.

In some examples, the filter may require multiple clock cycles to determine a state_out 232. In some cases, a longer clock cycle may reduce the need for the number of cycles required to determine state_out 232. Indeed, keeping the same number of clock cycles through the filter may become increasingly expensive and unnecessary as a clock cycle grows longer. In some examples, the latency caused by the multiple clock cycles is reduced by pipelining the logic of the filter 200. For example, filter 200 may require four clock cycles to complete the logic to determine state_out 232. When a longer clock cycle is indicated, some of the logic blocks shown in filter 200 may be bypassed when a pipeline_bypass signal or signals are provided. For example, logic blocks 206, 222, 240, etc. may be bypassed depending on the bypass signal(s). In some examples, the bypassing of these blocks allows the filter to complete in 1, 2, or 4 cycles depending on the bypass signals. In some examples, the bypass signals are static configuration inputs. These signals are implemented in the filter as select inputs to multiplexers on the output of flops, such that depending on the signal, either the data is stored in the flops until the next clock cycle or the data bypasses the flop to allow additional logic operations to complete in the same clock cycle. For example, if a signal pipeline_bypass[0] is a logic one, the output data from logic block 224 bypasses logic block 226 and continues on to logic block 228 in the same cycle. In some examples, the pipeline_bypass signals are equivalent to the freq_sel input 108.

The output of filter 200 is state_out 232, which can be converted in a control signal for controlling the stretching of a clock. For example, in filter 200 state_out 232 may be converted to a 4-bit control signal freq_ctl by a simple comparator with determined thresholds to convert the state_out into a control signal.

FIG. 3 is an example block diagram of components of an example clock phase generator and validator. After detecting the voltage droop and filtering the output sum into a state_out, the integrated circuit of the present invention responds to the voltage droops by stretching out the clock, allowing more time for the droop-affected logic to complete before raising the next clock cycle. Clock stretching may be achieved by choosing one from a distribution of independent clock phases. Each clock phase may be delayed from the previous phase by a nominally uniform interval, tphase. A set of clock gates and an OR function may implement the selection of the next phase as described in FIGS. 4 and 5. After each clock cycle, the selection may advance by freq_ctl, determined from the state_out signal from the filter, phases to add tphase*freq_ctl time to the clock cycle.

In some examples, a plurality of clock phases are generated. The plurality of clock phases may then be validated, wherein valid clock phases are phases that can be selected next to stretch the clock cycle. Clock validation criteria is described in greater detail in FIGS. 4 and 5.

In some examples, the clock phase generator and validator comprise clock phase generator and validator 300, respectively. In some examples, clock phase generator and validator 300 generates a plurality of clock phases, such as clock phases, 350, 360, 370 and 360. In some examples, clock phase generator 300 generates 64 independent clocks delayed by a nominal uniform interval such as tphase.

In some examples, a clock phase such as clock phase 350, is generated by utilizing a reference clock input refclk 170, select logic 320, logic blocks 302, 304, 306, 308, 310, 312, 314, 316, 318, 322, 324, 326, 328, 330, 332, 340, and logic blocks similar to the logic blocks listed, but not shown. The plurality of clock phases generated, including in some examples, clock phases 350, 360, 370, and 380 may be outputted from the clock phase generator and validator 300 in clock phase output 392.

Is some examples, a clock phase, such as clock phase 350, is validated by utilizing a current clock input such as clk_out 394, a reference clock input such as refclk 170, and logic blocks 318, 334, 336, 338, 342, 344, and 346. The plurality of clock phases determined to be valid, including in some examples, clock phases 350, 360, 370, and 380 may be outputted from the clock phase generator and validator 300 in valid clock phase output 390.

In some examples, the number of valid clock phases can change at any time. In order to validate the clock phases, clock phase generator and validator may include replica paths, which propagate a high signal for the entirety of the clock cycle, every other cycle. The value of the signal can be sampled by each generated phase using the phase[0] clock, distributed by a carefully controlled clock tree, such as carefully balanced clock tree 362, to ensure that every clock phase, such as clock phase 350 is sampled simultaneously. That data may then be sampled against the current stretched clock, such as clk_out 364, so as to be synchronous with the multiplexing circuitry and the filter. The sampling may be further configured to occur only during the cycle when the valid data is not propagating. In some examples, the valid output will be thermometer-coded: 1'b1 (high) for every valid phase and switch to 1'b0 (low) at the clock period, monotonically. In some examples, the phase generation and sampling logic is carefully positioned on the integrated circuit to minimize variability among the phases. There may still be a risk, however, that the valid data will not be monotonic, due to metastability during sampling or variations in the path delay that could not be removed. In particular, this will occur near the boundary between valid and invalid phases. To mitigate this risk, the number of valid phases may be reduced to be only those until the first 1'b0, counting from Phase[0].

In some examples, determining the number of valid phases is particularly important for cycling back to the start of the clock phase generators. For example, if an infinite string of phases were generated, a stretched clock could be walked forward indefinitely; however, at some instance the selected clock phase must cycle back around to the initial phase. In some examples, the cycle point, where the clock phase must cycle back, is close to but less than the clock period.

In some examples, the boundary between valid and invalid phases determines the cycle point. For example, if the last valid phase is more than a clock cycle less than the ideal cycle point (exactly one reference clock period), then a clock cycle which wraps around to an early clock phase will receive extra stretching by the difference. If, however, the last valid phase is after the ideal cycle point, a potentially fatal short clock cycle could result.

FIG. 4 is an example timing diagram of clock phases generated by a clock phase and validator, such as clock phase generator and validator 300. As discussed in connection with FIG. 3, the plurality of clock phases generated may also be validated, wherein valid clock phases are phases, which can be selected as next clock phases to stretch the clock cycle without causing errors in the integrated circuit. For example, phases may be valid only if the rising edge occurs before the next rising edge of phase 0 (the current phase), as shown in Equation 10:

$$\text{valid}_n = \begin{cases} 1 & nt_{phase} < T \\ 0 & nt_{phase} \geq T \end{cases} \quad (10)$$

In this equation T is the period of the reference clock, for example refclk 170, as shown in waveform 402.

In some examples, a selection of generated clock phases may be represented by waveforms 402, 404, 406, 408, 410, 412, 414, 416, and 418. In some examples, the current time may be represented by time 450, which in this example is on a rising edge of refclk waveform 402 and phase[0] waveform 404.

FIG. 5 is an example block diagram of components of an example clock phase multiplexer 500 configured to select a next clock phase and shift the current clock phase to the next clock phase.

In some examples, a clock phase multiplexer, such as clock phase multiplexer 500, determines a next clock phase signal such as clk_out 508 from received inputs, such as clock phase output 392 and valid clock phase output 390. In some examples, the clock phase multiplexer determines the next clock phase signal clk_out 508 by utilizing logic gates, such as logic blocks 502, 504, 506, 510, 512, 514, 518, 520, 522, and 524.

In some examples, another constraint on the selection of the clock phase may be that the next selected phase is not more than half the clock cycle delayed from the current phase to avoid a short pulse. For example, a clock phase multiplexer, such as clock phase multiplexer 500 may be in a current phase[0] as shown in waveform 404. Furthermore, the phase generator and validator 300 may have generated 54 valid phases. Furthermore, a control signal selection freq_clt 516 may indicate to advance 32 phases. In this example, at the rising edge of clk_out (phase 0) as indicated by time 450, the one-hot signal clk_enable 524 changes so that Phase[32] waveform 412 is selected. As shown in waveform 412, Phase[32] is high and more than a half cycle complete at time 450. Because Phase[32] is high, e.g., it is more than half a cycle shifted from phase[0], the latch in the clock gate, such as the clock gate formed by logic blocks 502 and 504, will not open immediately, but will open eventually. As shown in FIG. 4, for Phases[0]-[24], indicated by waveforms 404, 406, 408, and 410, the gate would have opened earlier and OR'ed the high part of its phase with the high part of phase 0, effectively extending the high part of this clock cycle. However, Phase[0] goes low at falling edge 452, before Phase[32] rises at rising edge 454. When Phase [32] does rise, possibly only a small fraction of the reference clock cycle later, it appears as a new rising edge of clk_out, which can drastically shorten the clock cycle, creating a short pulse.

In some examples, the multiplexer is configured to only select valid clock phases, which are also less than half a clock cycle delayed from the current phase. In some examples, freq_ctl 516 is a 4-bit value, which means that at least 30 phases must always be valid to avoid a short pulse. For example, there may be a range of clock phases for which the circuit can operate, such as 30*tphase-64*tphase. In some examples, the range in which the integrated circuit can operate is narrower because tphase is a function of process, voltage, and temperature. As a consequence, voltage droops can increase the minimum period of operation at the time freq_ctl is at its largest value.

In some examples, the integrated circuit is implemented with different clock phase generation paths, similar to the delay chain system 100, controlled by freq_sel. The delay cells between phases shown in FIG. 4 may be made of wide buffers to minimize variation and maintain a sharp edge. In some examples of the clock phase multiplexer 500, the clock gates, such as the logic blocks shown, are carefully placed to ensure similar distance routes from the generator to the multiplexer. In some examples, the OR gate that reduces the clock phases down to one output clock, such as logic block 506, may be constructed from two input NAND and NOR gates to minimize the delay difference from their input pins to their output. In some examples, these gates are ordered such that no phase experiences more than twice the (A2–A1) pin input delay (~1-2 ps) to its neighboring phase.

FIG. 6 is a flowchart illustrating an example method for handling voltage drop in on integrated circuit. At block 602, the integrated circuit power supply is monitored. In some examples, delay chain system 100, will monitor the power supply of the integrated circuit by determining a number of passing delay chains, such as passing_sum 169, during each clock cycle. For example, in an integrated circuit with a clock frequency of 1 GHz and 1-volt power, passing_sum 169 may indicate 100 delay chains passing, thereby indicating that there is no voltage droop.

At block 604, the integrated circuit is configured to detect a voltage droop, such as a dynamic loss, in the integrated circuit. In some examples, detecting a voltage droop includes measuring a lower number of passing delay chains in passing_sum 169. For example, during a voltage droop for the integrated circuit with an initial clock frequency of 1 GHz and 1 volt of power supply, passing_sum 169 may indicate 90 delay chains passing for a clock cycle, which may indicate a voltage droop. In some cases, the supply voltage may have drooped to 0.99 volts.

In some examples, due to the potential for electromagnetic noise on the integrated circuit, the passing_sum 169 of 90 delay chains is also filtered, such as in a filter 200. For example, in subsequent clock cycles the delay chain system 100 may indicate that the subsequent passing sums are 102, 98, and 100, which would indicate there is no voltage droop. As a result, the passing_sum 169 of only 90 would be filtered out, and no action would be taken by the integrated circuit to adapt to the voltage droop. In some examples, in subsequent clock cycles the delay chain system 100 may indicate that the subsequent passing_sums are 88, 91, and 80, which after being filtered by filter 200 indicates the detection of the early stages of a voltage droop. In some examples, this detected indication is outputted from the filter in state_out 232.

At block 606, a current clock cycle is stretched according to the detected voltage droop, to provide more time for logic on the integrated circuit to complete before a next clock cycle. In some examples, the detected voltage droop, such as state_out 232 is processed in a comparator to a control signal freq_ctl. In some examples, the clock phase generator and validator 300 and the clock phase multiplexer 500 are configured to receive the control signal, such as freq_ctl 516, and to select a valid clock phase such that the clock cycle is stretched. For example, the freq_ctl 516 may indicate the need for a clock frequency of 990 MHz instead of 1 GHz. Multiplexer 500 may then select a valid clock phase, which will provide the slower clock frequency.

In some examples, even at the slower clock frequency of 990 MHz, the delay chain system 100 and filter 200 may detect a further voltage droop. For example, passing_sum 169 may indicate 80 passing paths. Filter 200 may then detect a further droop after a plurality of subsequent lower passing_sum 169's. In response, freq_ctl 516 may now indicate the need for a clock frequency of 980 MHz, and clock phase multiplexer 500 may select a valid clock phase to provide the slower clock frequency. The clock delay system 100 and filter 200 may provide a constant monitor such that, during a stretched clock of a voltage droop, detecting further voltage droop and subsequent stretching of the clock can be completed.

In some examples, the input power will, over time, begin to furnish the required electrical current to the integrated circuit due to the increased operational load. Subsequently, voltage levels in the integrated circuit may begin to recover. For example, the voltage level may begin recovering from 0.90 volts to 0.91 volts and then to 0.92 volts. As the voltage level recovers, the number of delay paths that are passing any given clock cycle will start to increase. For example, passing_sum 169's may indicate 85 passing paths, then 87 passing paths, then 90 passing paths and subsequent increasing numbers of passing paths, indicating the recovery of the integrated circuit. Filter 200 may then detect the easing of the voltage droop after a plurality of subsequent higher passing_sum 169's. In response, freq_ctl 516 may now indicate the need for a faster clock frequency of 990 MHz from clock frequency 980 MHz and clock phase multiplexer 500 may select a valid clock phase to provide the faster clock frequency. In some examples, the power supply may recover, ending the voltage droop. In some examples, the delay chain system and filter may detect that the clock no longer needs to be stretched. For example, an integrated circuit with a clock frequency of 1 GHz and 1-volt power, passing_sum 169 may indicate 100 delay chains passing and, once filtered, may indicate that the voltage droop event has ended.

FIG. 7 is an example block diagram of components of an example integrated circuit. In some examples, an integrated circuit may comprise Integrated Circuit 700. In some examples, Integrated Circuit 700 may include a delay chain system, such as Delay Chain System 710. The Delay Chain System 710 may comprise a plurality of delay chains, wherein each delay chain comprises a delay chain path, and each delay chain path may comprise a different length. The Delay Chain System 710 may further include a controlled set of capture flops configured to sample each delay chain path every clock cycle to determine if the logic in the delay chain path completed during each clock cycle, as well an adder configured to sum the number of delay chain paths determined to have passed each clock cycle. In some cases, the delay chain system may further comprise a synchronizer configured to synchronize the sampled values from the delay chain path prior to summing the number of paths passing. The Delay Chain System 710 may, in some embodiments, comprise delay chain system 100 of FIG. 1, as described above.

In some examples, the Integrated Circuit 700 may include a filter, such as a Filter 720. In some cases, the Filter 720 may comprise a filter configured to filter the sum of the number of delay chain paths determined to have passed each clock cycle. For example, the Filter 720 may comprise filter 200, described in relation to FIG. 2. In some cases, for example, the Filter 720 may be configured as a Kalman filter, as described above.

In some embodiments, the Integrated Circuit 700 may include a clock phase generator and validator, such as the Clock Phase Generator and Validator 730. For example, the Clock Phase Generator and Validator 730 may comprise a clock phase generator and validator that are configured to generate a plurality of independent clock phases and are configured to determine a plurality of valid clock phases, as described above. In some cases, the Clock Phase Generator and Validator 730 may comprise clock phase generator and validator 300 described above in relation to FIG. 3.

The Integrated Circuit 700 may include a clock phase multiplexer, such as the Clock Phase Multiplexer 740. In some examples, the Clock Phase Generator Multiplexer 740 may comprise a clock phase multiplexer that is configured to shift from a current clock phase to a next clock phase selected from the plurality of valid clock phases. For example, in some embodiments, the Clock Phase Generator Multiplexer 740 may comprise a clock phase multiplexer 500, as described above in relation to FIG. 5.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. An integrated circuit comprising:
   a delay chain system comprising:
      a plurality of delay chains, wherein each delay chain comprises a delay chain path and each delay chain path comprises a different length;
      a controlled set of capture flops configured to sample each delay chain path every clock cycle to determine if the logic in the delay chain path completed during each clock cycle; and
      an adder configured to sum the number of delay chain paths determined to have passed each clock cycle;
   a filter configured to filter the sum of the number of delay chain paths determined to have passed each clock cycle;
   a clock phase generator and validator, configured to generate a plurality of independent clock phases and configured to determine a plurality of valid clock phases; and
   a clock phase multiplexer configured to shift from a current clock phase to a next clock phase selected from the plurality of valid clock phases.

2. The integrated circuit of claim 1, wherein the delay chain system further comprises a synchronizer configured to synchronize the sampled values from the delay chain path prior to summing the number of paths passing.

3. The integrated circuit of claim 1, wherein the filter configured to filter the sum of the number of delay chain paths determined to have passed each clock cycle is configured as a Kalman Filter.

4. A method for handling voltage droop on an integrated circuit comprising:
   monitoring a power supply voltage in the integrated circuit by:
      running a plurality of delay chains in the integrated circuit, wherein the plurality of delay chains comprises individual delay chain paths, each delay chain path comprising a different length;
      sampling each of the plurality of delay chain paths every clock cycle, wherein each delay chain path is sampled during a current clock cycle from a controlled set of capture flops to determine if the logic in the delay chain path completed during the current cycle;
      summing a number of valid delay chain paths to obtain a variable output sum, wherein valid delay chain paths comprise delay chain paths whose logic completed in the current cycle, and wherein the variable output sum is a representation of the power supply voltage level during each clock cycle;
   detecting a voltage droop comprising a dynamic loss of power supply in the integrated circuit; and
   stretching a current clock cycle, according to the detected voltage droop, to provide more time for logic on the integrated circuit to complete before a next clock cycle.

5. The method of claim 4, wherein monitoring supply voltage in the integrated circuit further comprises prior, to summing valid delay chain paths to obtain the variable output sum, synchronizing an output of each of the plurality of delay chain paths to prevent errors in the variable output sum due to metastability in the delay chain paths.

6. The method of claim 4, wherein detecting the voltage droop in the integrated circuit further comprises:
   filtering the variable output sum to reduce a difference between the output sum representation of the power supply voltage level and the actual supply voltage level experienced on the integrated circuit, wherein the difference is caused by circuit noise; and determining from the filtered variable output sum the voltage droop on the integrated circuit.

7. The method of claim 6, wherein filtering the variable output sum further comprises utilizing a Kalman filter.

8. The method of claim 4, wherein, stretching the current clock cycle further comprises:

generating a plurality of independent clock phases, wherein each of the plurality of clock phases comprises a rising edge, and wherein the plurality of independent clock phases together form a distribution of clock phases, wherein the rising edges of the plurality of clock phases in the distribution are offset by a uniform time interval;

determining a number of valid clock phases, wherein a valid clock phase comprises a clock phase comprising a rising edge which occurs before the rising edge of a current clock phase;

determining a next clock phase from the number of valid clock phases based on the detected voltage droop, wherein the next clock phase comprises a next clock rate which will allow the integrated circuit to complete all circuits in the next clock rate cycle; and shifting from the current clock phase to the next clock phase.

9. The method of claim 8, wherein determining a next clock phase further comprises:

determining from the valid clock phases a plurality of clock phases that are not delayed more than half a clock cycle from the current clock phase, and determining the next clock phase from the determined plurality of clock phases.

10. The method according to claim 4, further comprising:

monitoring supply voltage in the integrated circuit during the detected voltage droop;

detecting a recovery of supply voltage during the detected voltage droop; and dynamically adjusting the clock rate, according to the recovered supply voltage, to increase the clock rate.

* * * * *